United States Patent
Feyh

(10) Patent No.: US 9,166,066 B2
(45) Date of Patent: Oct. 20, 2015

(54) MICROMECHANICAL SENSOR APPARATUS HAVING A MOVABLE GATE AND CORRESPONDING PRODUCTION METHOD

(75) Inventor: Ando Feyh, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/347,503

(22) PCT Filed: Aug. 15, 2012

(86) PCT No.: PCT/EP2012/065942
§ 371 (c)(1),
(2), (4) Date: Jul. 2, 2014

(87) PCT Pub. No.: WO2013/045168
PCT Pub. Date: Apr. 4, 2013

(65) Prior Publication Data
US 2014/0374804 A1    Dec. 25, 2014

(30) Foreign Application Priority Data

Sep. 28, 2011    (DE) .......................... 10 2011 083 644

(51) Int. Cl.
*H01L 29/84*    (2006.01)
*H01L 21/02*    (2006.01)
*G01P 15/08*    (2006.01)
(Continued)

(52) U.S. Cl.
CPC ............ *H01L 29/84* (2013.01); *G01P 15/0802* (2013.01); *G01P 15/124* (2013.01); *H01L 21/02532* (2013.01); *H01L 21/30604* (2013.01); *H01L 29/16* (2013.01); *H01L 29/4916* (2013.01); *H01L 29/66568* (2013.01); *G01L 9/0098* (2013.01)

(58) Field of Classification Search
CPC ..... H01L 29/84; H01L 29/16; H01L 29/4916; H01L 29/66568; H01L 21/02532; H01L 21/30604; G01P 15/0802; G01P 15/124; G01L 9/0098
USPC .......... 438/49, 50, 51, 52, 222; 257/254, 415, 257/416, 417, E21.002, E21.219, E29.324; 365/185.01; 73/514.31
See application file for complete search history.

(56) References Cited

U.S. PATENT DOCUMENTS 4,671,852 A *   6/1987   Pyke ............................... 438/49
4,894,698 A     1/1990   Hijikigawa et al.
(Continued)

FOREIGN PATENT DOCUMENTS

DE    36 35 462 A1    4/1987
EP    0 990 911 A1    4/2000
(Continued)

OTHER PUBLICATIONS

International Search Report corresponding to PCT Application No. PCT/EP2012/065942, mailed Nov. 2, 2012 (German and English language document) (7 pages).
(Continued)

*Primary Examiner* — Dao H Nguyen
(74) *Attorney, Agent, or Firm* — Maginot, Moore & Beck LLP

(57) ABSTRACT

A micromechanical sensor apparatus having a movable gate includes a field effect transistor that has a movable gate, which is separated from a channel region by a cavity. The channel region is covered by a gate insulation layer.

5 Claims, 2 Drawing Sheets

(51) Int. Cl.
*G01P 15/12* (2006.01)
*H01L 21/306* (2006.01)
*H01L 29/16* (2006.01)
*H01L 29/49* (2006.01)
*H01L 29/66* (2006.01)
*G01L 9/00* (2006.01)

(56) References Cited

U.S. PATENT DOCUMENTS

| | | | |
|---|---|---|---|
| 5,504,356 A * | 4/1996 | Takeuchi et al. | 257/254 |
| 5,572,057 A * | 11/1996 | Yamamoto et al. | 257/417 |
| 5,922,212 A * | 7/1999 | Kano et al. | 216/2 |
| 8,704,314 B2 * | 4/2014 | Bozler | 257/415 |
| 2005/0227428 A1 * | 10/2005 | Mihai et al. | 438/222 |
| 2008/0134759 A1 * | 6/2008 | Mohammed-Brahim et al. | 73/31.06 |
| 2009/0014769 A1 | 1/2009 | Collonge et al. | |
| 2009/0317930 A1 | 12/2009 | Charvet | |
| 2014/0084349 A1 * | 3/2014 | Schelling et al. | 257/254 |
| 2014/0175525 A1 * | 6/2014 | Feyh et al. | 257/254 |

FOREIGN PATENT DOCUMENTS

| | | |
|---|---|---|
| EP | 2 060 532 A2 | 5/2009 |
| JP | 2010-123840 A | 6/2010 |

OTHER PUBLICATIONS

Kang et al.; Surface Micromachined Multi-Layer Moving Gate Field Effect Transistor (MOGFET) Pressure Switch with Integrated Vacuum Sealed Cavity; 12th Annual IEEE International Conference Orlando Florida, Micro Electro Mechanical Systems; Jan. 17-21, 1999; pp. 499-504; IEEE, Piscataway, New Jersey, USA.

Jachowicz et al.; FET pressure sensor and iterative method for modelling of the device; Sensors and Actuators; Apr. 1, 2002; pp. 369-378; vol. 97-98; Elsevier Science B.V., Lausanne, Switzerland.

* cited by examiner

MICROMECHANICAL SENSOR APPARATUS HAVING A MOVABLE GATE AND CORRESPONDING PRODUCTION METHOD

This application is a 35 U.S.C. §371 National Stage Application of PCT/EP2012/065942, filed on Aug. 15, 2012, which claims the benefit of priority to Serial No. DE 10 2011 083 644.6, filed on Sep. 28, 2011 in Germany, the disclosures of which are incorporated herein by reference in their entirety.

The disclosure relates to a micromechanical sensor apparatus having a movable gate and a corresponding production method.

BACKGROUND

Although applicable to any micromechanical components, the present disclosure and the problem addressed thereby are explained with reference to silicon-based components.

Micromechanical sensor apparatuses, for example inertial sensors, are usually realized by means of a capacitive or piezoresistive transducer. Although they have been available for some time now, sensors having a movable gate are not found on the market. A major reason for this is the production of the transducer element, in particular the provision of a suitable sacrificial layer process. Silicon oxide is usually used as a sacrificial layer in micromechanics. As a result, however, the channel region and the source/drain contacts are present in an open and unprotected manner, since the gate oxide is also inevitably removed as well when the sacrificial layer is removed. The channel region is then exposed in an unprotected manner, as are the PN junctions between source/drain and channel region. As a result, surface defects are produced which influence the operating range of the transistor or lead to drift or noise and reduce the suitability as a reliable sensor element.

EP 0 990 911 A1 describes a micromechanical sensor on the basis of the field effect transistor having a movable gate, which is movable in a direction parallel to the substrate surface, wherein the movement of the gate in this direction leads to an enlargement or reduction of the channel region overlapped by the gate in at least one MOSFET.

SUMMARY

The disclosure provides a micromechanical sensor apparatus having a movable gate and a corresponding production method multilayer system.

The concept underlying the present disclosure consists in the utilization of a sacrificial layer, e.g. a silicon sacrificial layer, which is selectively removable with respect to the gate insulation layer, for the purpose of releasing the movable gate electrode. Advantageously, the gate polysilicon or a polysilicon which is utilized in a CMOS process for producing resistances or capacitances is used as the sacrificial layer. Consequently, a maximum synergy can be utilized in CMOS integration since a layer present in the CMOS process can be used as the sacrificial layer.

When two polysilicon layers are present, the lower polysilicon layer can be used as the sacrificial layer and the upper polysilicon layer can be used as the gate electrode. In the case of a process with one polysilicon layer, the gate electrode is realized from metal (via or bottommost metal layer).

The sacrificial layer is preferably removed by means of $SF_6$, $ClF_3$ or $XeF_2$. These typical silicon etching media have e.g. a high selectivity with respect to $SiO_2$ as the gate insulation layer.

The disclosure makes it possible that, by means of the sacrificial layer proposed, the channel region and the source/drain regions are completely protected against external influences by means of a thermal oxide. These doped semiconductor regions can therefore be left in the same state as is usually the case in the CMOS process. In the case of silicon substrates, thermal oxides make it possible to realize virtually perfect interfaces and hence minimal defects. These defects, which would be generated in the case of a conventional oxide sacrificial layer, do not occur in an adverse manner according to the disclosure.

Alternatively, an SiGe or Ge layer can also be used as a sacrificial layer. It can either be provided by the CMOS process or else be deposited separately onto the channel region. Since SiGe or Ge can be deposited with a low temperature budget, for example approximately 400° C., the CMOS process, in particular the front end (diffusions), is not impaired. The sacrificial layer composed of Si or SiGe or Ge can be applied by means of PVD or LPCVD processes. Standard CMOS processes generally provide one or two LPCVD polysilicon layers.

The sacrificial layer can be deposited in a doped or undoped manner. Typical thicknesses are in the range of between 50 and 5000 nm, preferably 200 to 500 nm.

BRIEF DESCRIPTION OF THE DRAWINGS

Further features and advantages of the present disclosure are explained below on the basis of embodiments with reference to the figures.

In the figures.

DETAILED DESCRIPTION

In the figures, identical reference signs designate identical or functionally identical elements.

Figure 1A:
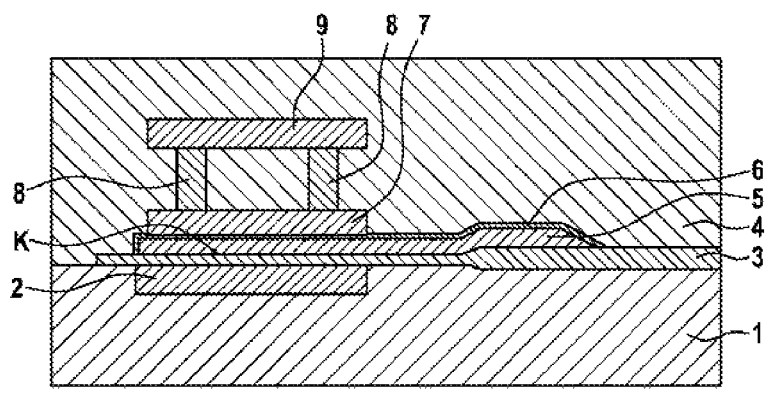
FIGS. 1a)-c) show schematic cross-sectional views for elucidating a micromechanical sensor apparatus having a movable gate and a corresponding production method in accordance with one embodiment of the present disclosure.
Figure 1B:
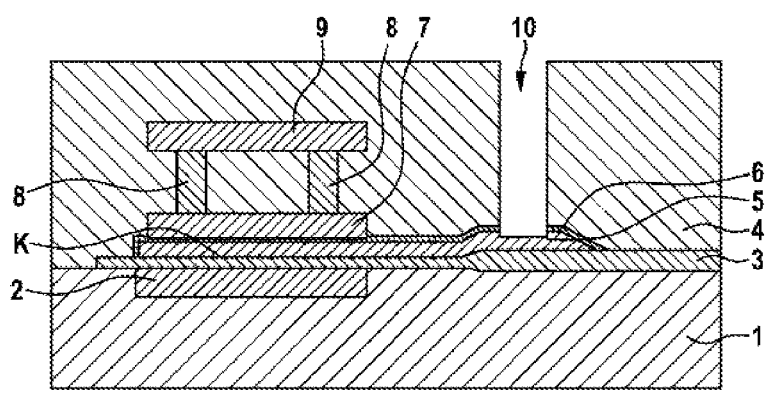
Figure 1C:
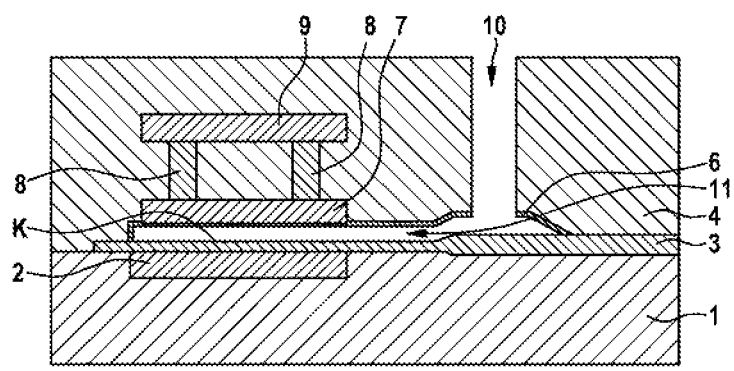

In FIG. 1, reference sign 1 designates a silicon substrate with a field effect transistor (FET)2, which has a channel region K and source/drain regions, the latter not being discernible in FIGS. 1a to c since these figures show a section through the channel region K.

The surface of the silicon substrate 1 is covered by a thermal oxide (gate oxide/LOCOS)3. Situated there above is the back-end stack of the CMOS process, in the environment of which the sensor is realized.

Reference sign 4 designates a dielectric insulation layer, e.g. an oxide layer. A first polysilicon layer 5 serves as a sacrificial layer and is covered with a thermal oxide layer 6. Situated thereabove is a second polysilicon layer 7, which serves as a gate electrode to be configured in a movable fashion. An electrical connection is effected by means of intermediate metal vias 8 and a metal layer 9 in the back-end stack. Tungsten plugs are typically used as vias 8. An alternative is Cu vias in so-called damascene processes (Cu-based semiconductor processes with a feature size typically starting from 90 nm).

Proceeding from the process state in accordance with FIG. 1a, anisotropic oxide etching of the dielectric layer 4 and of the thermal oxide layer 6 is carried out in order to produce an access to the first polysilicon layer 5 through an access hole 10. The access hole 10 lies laterally offset with respect to the field effect transistor 2 having the gate to be made movable, said gate being composed of the second polysilicon layer 7.

The sacrificial polysilicon layer 5 is etched through the through hole 10 by means of $SF_6$, $ClF_3$ or $XeF_2$ or the like in the form of gas phase etching. The gate oxide 3 and the thermal oxide layer 6 are not damaged by this sacrificial layer etching process. The field effect transistor 2 thus remains completely unaffected and intact. A plasmaless process is preferably employed as the etching process, in order to prevent the gate 7 or the gate oxide 3 from being charged.

In order to release the gate 7, a cavity 11 is thus produced without disturbing the transistor properties. The movable part of the sensor (mass, springs, gate) is thereby released.

The process state shown in FIG. 1c is followed by standard processes (not illustrated) for bonding a cap wafer, etc.

The disclosure can particularly advantageously be applied to structurally small and cost-effective highly sensitive and robust MEMS sensors, such as, for example, inertial sensors, pressure sensors, imagers, etc.

Although the present disclosure has been described on the basis of preferred exemplary embodiments, it is not restricted thereto. In particular, the abovementioned materials and topologies are merely by way of example and not restricted to the examples explained.

Although a CMOS process with two polysilicon layers was used in the embodiment described, it is also conceivable to use a process with a single polysilicon layer. Here the bottommost metal layer or the vias between bottommost metal layer and polysilicon layer would form the movable gate electrode.

The invention claimed is:

1. A method for producing a micromechanical sensor apparatus having a movable gate, comprising;
    forming a channel region and source/drain regions in or on a semiconductor substrate;
    forming a gate insulation layer on the channel region;
    forming a sacrificial layer on the gate insulation layer, which is selectively etchable with respect to the gate insulation layer;
    forming a gate electrode on the sacrificial layer;
    forming a dielectric insulation layer on the gate electrode;
    forming an access hole to the sacrificial layer in the dielectric insulation layer; and
    sacrificial layer etching the sacrificial layer through the access hole to form a field effect transistor having a movable gate, which is separated from the channel region by a cavity, wherein the channel region remains covered by the gate insulation layer.

2. The method as claimed in claim 1, further comprising forming a dielectric layer between the sacrificial layer and the gate electrode, said dielectric layer remaining below the gate electrode during the sacrificial layer etching.

3. The method as claimed in claim 1, wherein the sacrificial layer etching is effected using $SF_6$ or $XeF_2$ or $ClF_3$ in a gas phase.

4. The method as claimed in claim 1, wherein the sacrificial layer is formed from polysilicon or from silicon/germanium or from germanium.

5. The method as claimed in claim 1, wherein the sacrificial layer etching includes a plasmaless method.

\* \* \* \* \*